(12) United States Patent
Uhlemann (10) Patent No.: US 11,081,313 B2
(45) Date of Patent: Aug. 3, 2021

(54) PARTICLE-OPTICAL CORRECTOR WHICH IS FREE FROM AXIAL ABERRATIONS OF SIXTH ORDER AND ELECTRON MICROSCOPE WITH CORRECTOR

(71) Applicant: CEOS Corrected Electron Optical Systems GmbH, Heidelberg (DE)

(72) Inventor: Stephan Uhlemann, Heidelberg (DE)

(73) Assignee: CEOS Corrected Electron Optical Systems GmbH, Heidelberg (DE)

(*) Notice: Subject to any disclaimer, the term of this patent is extended or adjusted under 35 U.S.C. 154(b) by 0 days.

(21) Appl. No.: 16/932,711

(22) Filed: Jul. 18, 2020

(65) Prior Publication Data

US 2021/0050179 A1    Feb. 18, 2021

(30) Foreign Application Priority Data

Aug. 15, 2019 (DE) .......................... 102019122013.0
Jul. 15, 2020 (EP) ..................................... 20186011

(51) Int. Cl.
*H01J 37/153* (2006.01)
*H01J 37/26* (2006.01)

(52) U.S. Cl.
CPC ............ *H01J 37/153* (2013.01); *H01J 37/26* (2013.01); *H01J 2237/1534* (2013.01)

(58) Field of Classification Search
CPC ... H01J 37/153; H01J 37/26; H01J 2237/1534
See application file for complete search history.

(56) References Cited

U.S. PATENT DOCUMENTS

2011/0114852 A1* 5/2011 Henstra .................. H01J 37/26
250/396 R

FOREIGN PATENT DOCUMENTS

DE          10001277 A1    7/2001
DE     102006017686 A1   10/2007
(Continued)

OTHER PUBLICATIONS

M. Haider et al., Development of Aberration Correctors for the HD-2700, the HF3300S, the 1.2 MV First Program, and Future Prospects, Hitachi Review 65 (2016), pp. 191-195.

*Primary Examiner* — Nicole M Ippolito
*Assistant Examiner* — Hanway Chang
(74) *Attorney, Agent, or Firm* — Michael Soderman (57) ABSTRACT

A corrector has a strength of a central hexapole field ($\Psi_{HP2}$) which is selected such that the threefold axial astigmatism ($A_2$) vanishes and the strengths of two equal outer hexapole fields ($\Psi_{HP1,3}$) are selected such that the overall corrector (5) does not have a sixfold axial astigmatism ($A_5$). The length (L) of the central multipole element (2) in relation to the lengths (L') of the multipole elements (1 and 3) is chosen such that the axial three-lobed aberration of sixth order ($D_6$) vanishes. A separation between the outer multipole elements (1 and 3) and round lenses (7", 8") further spaced apart from a symmetry plane (6) of the corrector corresponds to the focal length (f') of those round lenses (7", 8") plus an additional separation ($\Delta z$) which is chosen such that the axial three-lobed aberration of fourth order ($D_4$) vanishes for the given lengths L and L'.

19 Claims, 7 Drawing Sheets

(56) References Cited

FOREIGN PATENT DOCUMENTS

| | | | |
|---|---|---|---|
| EP | 0451370 | B1 | 10/1991 |
| EP | 2325862 | A1 | 5/2011 |
| EP | 2325863 | B1 | 5/2011 |
| EP | 3255649 | A1 | 12/2017 |

* cited by examiner

Fig. 3H

PARTICLE-OPTICAL CORRECTOR WHICH IS FREE FROM AXIAL ABERRATIONS OF SIXTH ORDER AND ELECTRON MICROSCOPE WITH CORRECTOR

CROSS REFERENCE TO RELATED APPLICATIONS

This application claims the priority of DE 102019122013.0 filed on 2019 Aug. 15, and the priority of EP 20186011.1 filed on 2020 Jul. 15; these applications are incorporated by reference herein in their entirety.

BACKGROUND OF THE INVENTION

The invention relates to a particle-optical corrector for correcting the aperture aberrations of an electron microscope, thereby preventing threefold axial astigmatism, axial three-lobed aberration of fourth order, and sixfold axial astigmatism, wherein the corrector comprises a central multipole element of length L for generating a hexapole field in the symmetry plane of the corrector as well as two outer identical multipole elements of length L' for generating identically strong hexapole fields, and two round lens doublets with round lenses, wherein the round lenses which are closer to the symmetry plane are arranged at a separation from the symmetry plane equal to the focal lengths of the round lenses and the round lenses which are further away from the symmetry plane are disposed at a separation from the round lenses which are disposed closer to the symmetry plane, which is equal to their focal lengths plus the focal lengths of the round lenses which are disposed closer to the symmetry plane.

Electron-optical imaging systems are used both for magnification as in the case of electron microscopy, and for downsizing in electron projection lithography. The considerably higher resolution, which results from the considerably reduced wavelength of the imaging optical radiation, is advantageous compared to light-optical imaging systems. In comparison to light, electron-optical imaging systems achieve an improvement in resolution by a factor of approximately $10^4$ in dependence on the acceleration voltage such that images down to the atomic region become possible.

Guidance of electron beams for imaging purposes is realized by means of electric and/or magnetic lenses. Lens systems of this type exhibit various image aberrations to a greater extent than light-optical systems in dependence on their structure and arrangement.

The purpose of particle-optical correctors consists in compensating aperture aberrations and, if necessary, chromatic aberrations of the optical components of the microscope. Compensation using such correctors also results in aberrations caused by the corrector itself.

These errors are parasitic aberrations, which result from material and dimensioning errors, and are alignment aberrations. There are also intrinsic residual aberrations due to physical reasons, i.e. which would also occur within a particle optics of flawless construction. The latter must be accepted in order to achieve the primary purpose of correction of the imaging lenses. These residual aberrations must be minimized or largely prevented to achieve a maximum achievable optical quality of the image using the corrector.

The aberrations include chromatic and geometrical aberrations. The geometrical aberrations are categorized according to image aberration figures which occur in various orders. In this connection, classification according to the Seidel order is commonly used. A list of such aberrations can be found in Rolf Erni, "Aberration-Corrected Imaging in Transmission Electron Microscopy—An Introduction", 2010, pages 222, 224 and 225 including a table of differing aberration nomenclatures on page 225.

The basis for the function of all correctors in particle optics is the realization by O. Scherzer (O. Scherzer: "Sphärische and chromatische Korrektur von Elektronen-Linsen" (spherical and chromatic correction of electron lenses) OPTIK, DE, JENA, 1947, pages 114-132, XP002090897, ISSN: 0863-0259), that correction of chromatic and aperture aberrations is possible for particle optics by generating non-rotational symmetrical fields using multipoles in order to form a non-rotational symmetric beam, performing aberration correction on this beam and again forming a round beam using oppositely acting fields.

The aberration correction entails the corrector producing aberrations which are opposite to the aberrations of the optical system and therefore compensate these aberrations. However, such correctors produce aberrations themselves, which must also be compensated as far as possible within the corrector.

The geometric aberrations distort the wave fronts of the light or, in particle optics, of the particle beams into a non-spherical shape, wherein the corrector must reproduce this shape to a maximum degree or has to distort it in such a way that it becomes spherical again after occurrence of subsequent aberrations. With respect to the basics of this correction of wave fronts, reference is made to Rolf Erni (location cited pages 214-228, chapter "7.5 Wave Surface, Aberration Function and Image Aberrations").

All this serves to achieve high resolution images of thin slices within a sample and therefore an optimum setting of the microscope. This aim is achieved the better the higher the order of the aberrations up to which all aberrations are compensated. However, in practice—in contrast to theory that can be calculated—each further aberration correction has retroactive effects on already compensated aberrations, which reoccur and must be compensated again. For this reason, one has to approach an optimum aberration correction with a systematic iterative method. In practice, it is thus not possible to completely eliminate all aberrations up to a certain order, but to reduce them such that they no longer influence the desired image quality with respect to resolution and sharpness in a manner relevant to the result. Therefore, the aim is theoretical perfection, but practice is about the availability of the image quality for the respective purpose of use of the electron microscope. This is what is meant by the elimination or correction of an aberration.

There are known aperture aberration correctors which prevent residual axial aberrations up to fifth order. If, however, with these correctors, the aberrations up to fifth order have been corrected, a three-lobed aberration of sixth order becomes so dominant that it disturbs the image quality in an inacceptable manner if the lens aperture is opened further. The known correctors are correctors comprising two or three hexapoles with intermediately arranged round lens doublets.

The correctors with two hexapoles are the corrector EP 0 451 370 B1 (Rose) and also further developments of this corrector, e.g. Müller H., Uhlemann S., Hartel P., and Haider M. (2006) "Advancing the Hexapole Cs-corrector for the scanning transmission electron microscope." Microsc. Microanal. 12: 442-455. A corrector comprising three hexapoles is disclosed e.g. in EP 3 255 649 A1 or DE 10 2006 017 686 A1. Also known is the delta corrector (Sawada et. al. "Correction of higher order geometrical aberration by triple threefold astigmatism field", Journal of Electron Microscopy 58(6): 341-347 (2009)).

EP 3 255 649 A1 (Morishita) proposes to measure the axial three-lobed aberration of sixth order to then reduce the phase variations caused by the three-lobed aberration of sixth order ($D_6$) by means of the aberrations of the threefold axial astigmatism ($A_2$) and the axial three-lobed aberration of fourth order ($D_4$). In this way, however, the axial three-lobed aberration of sixth order has not been eliminated but merely the phase deviation is improved. For this reason, this is not an aberration correction, merely an optimization.

The paper by Morishita et. al. "Evaluation of residual aberration in fifth-order geometrical aberration correctors" (Microscopy, 2018, 156-163) discusses the question whether these correctors comprising two or three hexapoles can eliminate the three-lobed aberration of sixth order. This paper comes to the conclusion that the three-lobed aberration of sixth order ($D_6$—referred to therein as $R_7$) cannot be prevented with the correctors comprising two hexapoles nor with the correctors comprising three hexapoles such as the delta corrector.

EP 2 325 862 A1 and EP 2 325 863 B1 (both Henstra) propose on the basis of the above-mentioned Rose corrector comprising two hexapoles, to add an additional hexapole with a weak hexapole field to the round lens doublet between the two hexapoles. This weak hexapole field either corrects the sixfold astigmatism of fifth order ($A_5$) or the three-lobed aberration of sixth order ($D_6$) (see claim 1 in each case). Both documents (EP 2 325 862 A1 under [0071] and EP 2 325 863 B1 under [0074]) mention the idea of simultaneously correcting the sixfold astigmatism of fifth order ($A_5$) and also the three-lobed aberration of sixth order ($D_6$) together with a twelve pole which is disposed downstream of the corrector in the direction of the objective lens before a transfer lens doublet (FIG. 2, reference numeral 128). The theory is indeed correct, the practical realization, however, fails due to two facts: In order to achieve the desired effect, the twelve-pole field would have to have a strength that cannot be realized in practical technical implementations. Moreover, a residual chaple aberration ($G_7$) occurs in this arrangement whose effect is even larger than the eliminated three-lobed aberration of sixth order ($D_6$) and thus completely fails the purpose of an improvement (see FIG. 3e).

The delta corrector (see above) is a corrector of the above-mentioned type by means of which the aperture aberration ($C_s$) can be corrected thereby preventing the axial astigmatism ($A_2$), the axial three-lobed aberration of fourth order ($D_4$) and the sixfold axial astigmatism ($A_5$), but not the three-lobed aberration of sixth order ($D_6$). This was examined both mathematically and experimentally by Morishita et. al. (see above) and the result was summarized on page 162 (top left) (loc. cit.).

For this reason, it is the underlying object of the invention to provide an aperture aberration corrector which prevents all non-circular axial aberrations up to fifth order and the three-lobed aberration of sixth order without introducing aberrations that would render the achieved improvement useless.

SUMMARY OF THE INVENTION

This object is achieved with a particle-optical corrector of the above-mentioned type in that the strength of the central hexapole field with respect to the strengths of the two identically strong outer hexapole fields is chosed such that the threefold axial astigmatism vanishes and the strengths of the latter are selected such that the corrector altogether does not have a sixfold axial astigmatism, that the separation between the multipole elements and the round lenses further away from the symmetry plane is equal to their focal length plus an additional separation, wherein the latter is selected such that the axial three-lobed aberration of fourth order vanishes for the given lengths of the central multipole element and the given lengths of the identical multipole elements, and that the length of the central multipole element relative to the length of the two outer identical multipole elements is chosen such that the axial three-lobed aberration of sixth order vanishes—for the predetermined ratio of the focal length of the round lenses closer to the symmetry plane to the focal length of the round lenses further away from the symmetry plane.

DETAILED DESCRIPTION

The starting point of the invention is that the internal combination aberrations of the threefold axial astigmatism ($A_2$) and the axial three-lobed aberration of fourth order ($D_4$) with the hexapole field and on the other hand the internal combination aberrations of the sixfold axial astigmatism ($A_5$) with the hexapole field must eliminate each other. This comprises that the beam through a hexapole field is at first deformed and then made round again by a subsequent hexapole field. Undesired aberrations that are already present are eliminated in the non-rotational symmetric beam region and other aberrations are generated with opposite sign for the subsequent compensation of subsequent aberrations. With the multipole elements of the invention, this deformation and the return to a round shape occur as follows: The beam enters the first multipole element, is deformed there and is made round again in the first half (before the symmetry plane) of the central multipole element after aberration compensation of the above-mentioned type. In the second half of the central multipole element (after the symmetry plane) the beam is deformed again in order to be made round again in the second multipole element which is identical to the first. Also in this case, aberrations are compensated in the non-rotational symmetric beam region.

The above-mentioned combination aberrations result in aberration contributions which can be represented in the hexapole field by vectors in a two-dimensional plane, i.e. $a \hat{=} D_4+A_2$ with the hexapole field and $b \hat{=} A_5$ with the hexapole field. Without the invention, these vectors a and b form a triangle, wherein the third side c of the triangle is the vector of the resulting axial three-lobed aberration of sixth order ($D_6$). In the conventional literature (e.g. Morishita et. al.—see above), they partially act in the same direction such that the resultant c has a larger magnitude than a and b alone. It is the object of the invention for both vectors a and b to be oriented antiparallel to another in order to reduce the axial three-lobed aberration of sixth order ($D_6$) to zero.

A further aim is to focus the aberration-corrected beam with a maximal large aperture angle ($\alpha$) into the sample in order to bring the diffraction limit to a low level. The measure for the diffraction limit is $\lambda/\alpha$. In light optics, the angle $\alpha$ is much larger than in electron microscopy. The latter has a much smaller diffraction limit due to the fact that the wavelength $\lambda$ of electron beams is much smaller than that of light waves.

Four ratios are decisive for the invention:

First of all, the ratio of the hexapole strengths, i.e. the strength of the central multipole ($\Psi_{HP2}$) with respect to the strengths ($\Psi_{HP1,3}$) of the two other outer identical multipole elements. (For generating hexapole fields, hexapole elements or multipole elements comprising more poles can be used.)

Second of all, the strengths of the outer hexapole fields must be selected such that the overall corrector does not have sixfold axial astigmatism.

In addition, the ratio d of the measure of the additional separation of the central planes of the outer identical hexapoles with respect to the focal planes of the outer transfer lenses (7", 8") Δz to the length L' of the outer identical multipole elements (1, 3) is relevant.

Also relevant is the ratio of the length L of the central multipole element 2 to the length L' of the two outer identical multipole elements 1 and 3.

With respect to the ratio between the hexapole strengths $\Psi_{HP2}$ and $\Psi_{HP1,3}$:

The strength of the hexapole fields Ψ results from the winding number N multiplied by the current strength I, with the radius R of the bore also being relevant according to the following formula:

Strength of the hexapole: $\Psi = \mu_0 \cdot N \cdot I \cdot R^{-3}$

Permeability of the vacuum: $\mu_0 = 4\pi \cdot 10^{-7}$ As/Vm.

The required strength ratio of the central hexapole field $\Psi_{HP1}$ with respect to the strength of the two other identical hexapole fields $\Psi_{HP2,3}$ is represented by the following formula which leads to the absence of threefold axial astigmatism ($A_2$):

$$\frac{\Psi_{HP2}}{\Psi_{HP1,3}} = \frac{2}{k \cdot M^3}$$

k is thereby the ratio of the length L of the central multipole element (2) to the lengths L' of the two other identical multipole elements (1, 3), i.e.

$k = L/L'$

M is the ratio of the focal lengths f of the round lenses (7', 8') that are located closer to the symmetry plane to the focal lengths f' of those located further away (7", 8"), i.e.

$M = f/f'$

Referring to the strengths ($\Psi_{HP1,3}$) of the outer hexapole fields:

These must be selected in such a manner that the overall corrector does not have sixfold axial astigmatism ($A_5$). This problem was already addressed by the above-mentioned publication Müller et. al. (2006), wherein this corrector was a two hexapole corrector in which the x component of the $A_5$ aberration ($A_{5x}$) was eliminated, however a smaller y component of the aberration $A_5$, i.e. $A_{5y}$ remains. Since this invention deals with a three hexapole corrector, $A_{5y}$ vanishes for symmetry reasons.

Referring to the magnitude of the additional separation Δz:

This is the shift of the central planes of the two identical outer multipoles in addition to the separation by the focal length f' of the outer round lenses (7" and 8"), i.e. the shift from their focal lengths in the outward direction.

Referring to the ratio d of the degree Δz with respect to the length L' of the two identical multipole elements (1 and 2), the following applies:

$$d = \frac{\Delta z}{L'} = \frac{10k - \sqrt{5} \cdot \sqrt{9M^4 - k^2}}{30M^2}$$

For this reason, the following must apply: Δz=d·L'

In this way, the three-lobed aberration of fourth order ($D_4$) vanishes. k and M have already been defined above. This formula* is an approximation formula, since it is based on the assumption of a box-shaped hexapole field (in reality, the hexapole field expands somewhat past the length L or L').

In accordance with the invention, this feature of freedom from the three-lobed aberration of fourth order ($D_4$) must also be met. In case of the delta corrector, this ratio is different, in this case d=0 and thus Δz=0. The two outer hexapole fields of the delta corrector are located at the focal lengths of the outer round lenses relative to the symmetry plane. Therefore, the outer hexapole elements are rotated relative to one another in order to be free from the axial three-lobed aberration of fourth order ($D_4$) (see the above-mentioned paper by Morishita et. al., there page 158, FIG. 1b).

Referring to the ratio of the length L of the central multipole element 2 to the lengths L' of the outer identical multipole elements 1 and 3:

The main issue here is the condition for the mutual elimination of the two vectors a and b, i.e. that the aberrations $A_2$ and $D_4$ that are generated in all hexapole fields subsequently generate a combination aberration $D_6$ in these hexapole fields, which is cancelled by the oppositely directed combination aberration $D_6$ in the central hexapole field caused by the aberration $A_5$. This cancellation is achieved by appropriately choosing the length L of the central multipole element 2 with respect to the lengths L' of the identical multipole elements 1 and 3.

For vector a (which is approximately real according to the invention), this can be described with the following formula:

$\Delta D_{6x}^{(a)} = 3 \int \Psi(z) \cdot X_{\langle A2 \rangle}(z) \cdot X_{\langle D4 \rangle}(z) \cdot u_\alpha(z) dz$ and for vector b:

$\Delta D_{6x}^{(b)} = 3 \int_{HP2} \Psi(z) \cdot X_{\langle A5 \rangle}(z) \cdot u_\alpha^2(z) dz$ $X_{\langle A2 \rangle}$, $X_{\langle D4 \rangle}$ and $X_{\langle A5 \rangle}$ are thereby the aberration paths of the aberrations $A_2$, $D_4$ and $A_5$ respectively, and $u_\alpha$ is the axial fundamental paths that emanates from the point source and is focused by the objective lens into the object plane. The y components of the vectors can be neglected due to the identical orientation of the hexapoles (in contrast to the delta corrector).

Ultimately, the above-mentioned three ratios are linked, as is already obvious from the formulas, wherein it is important to find values in each case that meet the three mentioned conditions. The theoretical fulfilment of conditions must then of course be adapted to the precise ratios for individual electron microscopes which differ from each other depending on the requirements and purpose of use and exhibit deviations from the theoretical calculation due to construction imperfections.

Figure 1:
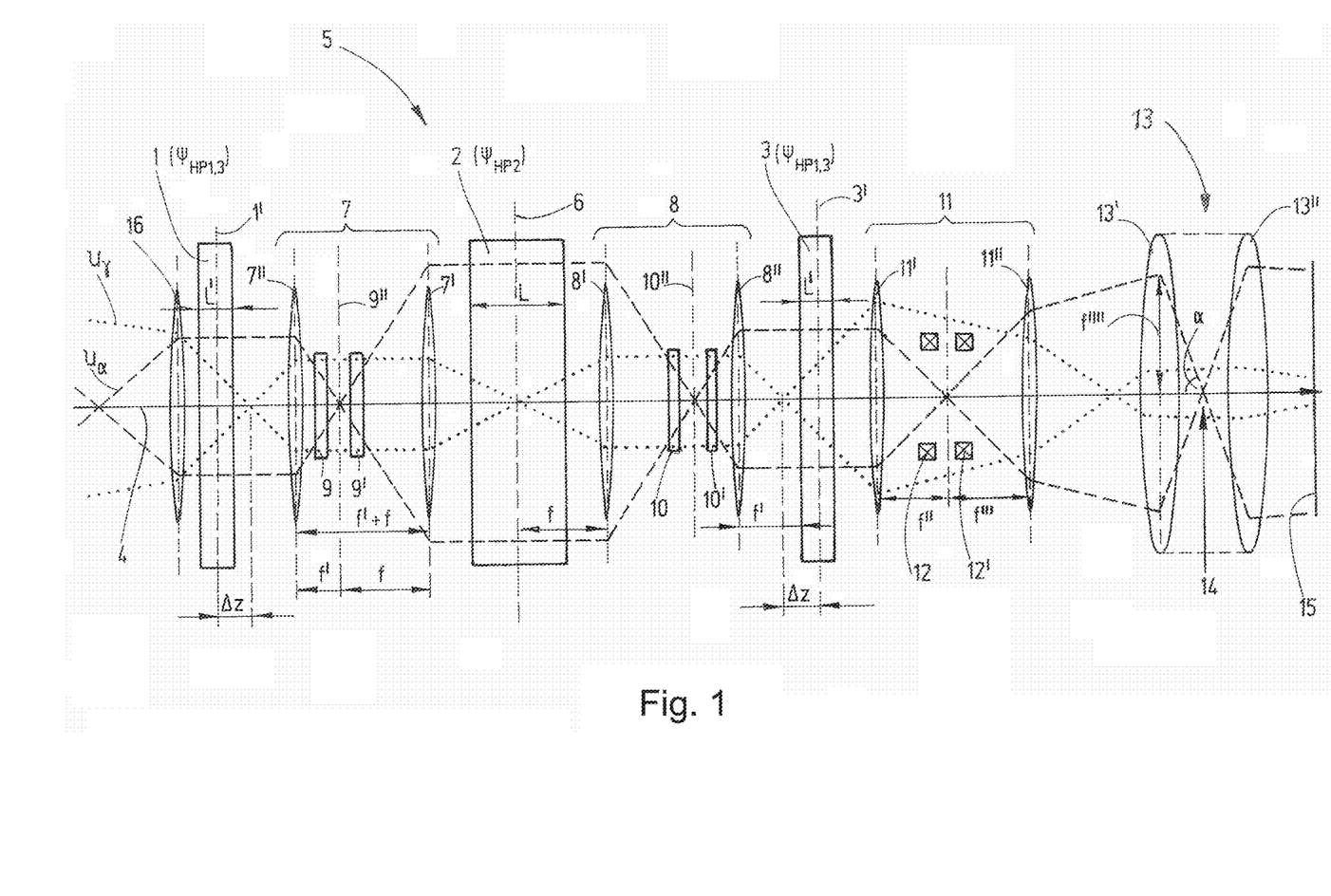
FIG. 1 shows an embodiment of an inventive corrector and a transfer lens system.

A beam path as claimed and illustrated by means of an embodiment in FIG. 1 is theoretical and for this reason an ideal which cannot be achieved in practice since the production of components is always subject to imperfections, even if these are very small. However, correctors are delicate systems which already differ from their predetermined function due to the slightest machining errors. If only components were used that achieve very small tolerance, one would produce many components having unacceptable quality, which would be very uneconomical.

However, there is the possibility of counteracting such imperfections by slightly changing certain parameters such as e.g. changing the excitation of a lens with the consequence of a small change of the beam path, which is then corrected again by a modified excitation of another lens to ensure that the inventive focus is maintained. Typically, a change in excitation in a range of up to 5% is sufficient. Thus, a certain degree of freedom of adjustment is utilized.

Examples for such correcting changes are changes in excitation of one or both outer round lenses (in the illustrated embodiment these are 7" and 8") with a focal length correction through excitation change of the lens adjacent to the respective outer hexapole, i.e. the condenser lens (16) or the first transfer lens (11'). Other possibilities of this type are also feasible.

When such a correction is made, the undesired parasitic aberrations determine the direction of the correction to be made. The extent of the correction is performed in a result-oriented manner.

Such highly limited deviations cause similar limited deviations of other parameters. As is the case in basically any invention which is defined by mechanical or electric parameters, tolerance regions must be included in the scope of protection for this invention within the functional achievement of results. The inclusion of limits in the scope of protection results anyway already from the fact that beam limitations in a real beam path always represent regions and not exact lines.

This is not a deviation from the inventive principle but a correction in the actual implementation in order to achieve the inventive principle.

Dependent claims recite useful ranges and precise optimum ratios:

The ratio d= $\Delta$ z/L', i.e. of the additional separation $\Delta$z with respect to the lengths L' of the outer identical multipole elements 1 and 3 is suitably in a range of 0.5 to 0.95.

The ratio between the strength of the hexapole field $\Psi_{HP2}$ of the central multipole element 2 and the strength $\Psi_{HP1,3}$, i.e.

$$\frac{\Psi_{HP2}}{\Psi_{HP1,3}}$$

is preferably in a range of 0.33 to 1.7.

The ratio M of the focal lengths f' of the round lenses 7' and 8' lying closer to the symmetry plane 6 to the focal lengths f0 of the round lenses 7" and 8" lying further away, i.e. M=f/f', is suitably in a range of 0.8 to 1.2, preferably however at M=1.15 with a tolerance of ±0.01.

The ratio k of the length L of the central multipole element 2 to the length L' of the outer multipoles 1 and 3, i.e. k=L/L' in a range of 2.0 to 3.5, is preferably k=3.05 (±0.05).

A further development of the inventive corrector is used for compensation of parasitic aberrations caused by construction errors, wherein aberrations are generated which compensate the aberrations caused by construction errors. For this purpose, the symmetry planes of hexapole doublets additionally arranged between the round lenses of the round lens doublets are disposed at a separation equal to the focal lengths of the round lenses located closer to the symmetry plane and at a separation equal to the focal lengths of the round lenses located further away from the symmetry plane, wherein the hexapole doublets are constructed and excited in such a manner that small variations of the three-lobed aberration of fourth order can be generated within the connector with inverted signs for compensating aberrations caused by construction errors.

Further aberrations can be partly counterbalanced for in that the symmetry planes of hexapole doublets additionally arranged between the round lenses of the round lens doublets are disposed at a separation equal to the focal lengths of the round lenses located closer to the symmetry plane and at a separation equal to the focal lengths of the round lenses located further away from the symmetry plane, wherein the hexapole doublets are constructed and excited in such a manner that small variations of the residual aberrations, in particular $D_8$, $A_5$ become possible, which permit the compensation of parasitic aberrations or the minimization of the influence of higher order aberrations of the same multiplicity, in particular $D_8$ and $G_7$.

This minimization is not a correction but an optimization supplementing the inventive correction similar to EP 3 255 649 A1 by Morishita which was described above. This means that the aberration is not corrected but its effect on the image quality is minimized. This further development leads to an image improvement corresponding to that of FIG. 3i compared to FIG. 3h, described below.

The invention also relates to an electron microscope that is provided with the above-described corrector. This electron microscope is preferably a scanning electron microscope (SEM) or a scanning transmission electron microscope (STEM).

It may also be a transmission electron microscope (TEM), in which the corrector is arranged downstream of the beam path of the objective lens.

In transmission electron microscopes of this type, the beam path is reversed compared with the above-mentioned electron microscopes and the one illustrated by way of example in FIG. 1. Such reversals are known in the art and reference in this respect is made to the publication R. Ernie, "Aberration-Corrected Imaging in Transmission Elektron Microscopy", 2010, page 48, Foot note 1. This also includes reference to Pogany and Turner, 1968, as well as Cowley, 1969, who taught the reciprocity theorem.

In one of the above-mentioned microscopes, a transfer lens system is suitably inserted between the corrector and the objective lens, with which spherical aberrations can be corrected. A transfer lens system of this type may consist of one transfer lens as well as of two transfer lenses.

The transfer lens system with two transfer lenses is suitably designed in such a manner that the transfer lenses have different focal lengths such that they eliminate the objective lens spherical aberrations. In this connection, it may be provided that the focal lengths of the transfer lenses can be adjusted by means of excitation of the coils of the transfer lenses for eliminating the precise objective lens spherical aberrations.

The invention is explained in more detail below with reference to the drawing.

DESCRIPTION OF THE PREFERRED EMBODIMENT

The correction effect of the aberration correction of the inventive corrector in comparison with the aberration corrections of the correctors of prior art is shown in FIGS. 3a to 3i by means of ronchigrams.

FIG. 1 shows an embodiment of an inventive particle-optical corrector 5 and an embodiment of a transfer lens system 11 added in accordance with a further development. The installation in an electron microscope is schematically illustrated by the optical axis 4, the condenser lens 16 and an objective lens 13 with two objective lens fields 13', 13" with focal lengths f"" and by the detector 15 which is used for generating images in a scanning electron microscope. The intermediate lenses are omitted. The sample 14 is located between the objective lens fields 13 and 13'. The objective lens 13 may also comprise only one objective lens field behind which the sample is located. $u_\alpha$ shows the axial beam path and $u_\gamma$ shows the off-axis beam path.

The corrector 5 consists of three multipole elements 1, 2 and 3, a central multipole element 2, which lies in the symmetry plane 6 of the corrector 5, and of two outer multipole elements 1 and 3 which are identical. The central multipole element 2 comprises a hexapole field of strength $\Psi_{HP2}$ and length L. The two outer multipole elements 1 and 3 comprise hexapole-fields of strength $\Psi_{HP1,3}$ and length L'. Round lens doublets 7 and 8 with round lenses 7', 7" and 8', 8" are arranged between the multipole elements 1, 2 and 3. The round lenses 7' and 8' are arranged at a distance from the symmetry plane 6 equal to their focal lengths f and the round lenses 7" and 8" with focal lengths f' have a separation from the round lenses 7' and 8' equal to the sum of both focal lengths f and f'. The outer identical multipole elements 1 and 3 have a separation from the round lenses 7" and 8" equal to their focal length f' plus an amount $\Delta z$, wherein these separations are each relative to the symmetry planes 1', 6 and 3' of the hexapole elements 1, 2 and 3, and to the symmetry planes of the round lenses.

As already described above, the ratio between the strength of the hexapole field $\Psi_{HP2}$ of the central multipole element 2 and the strengths of the hexapole fields $\Psi_{HP1,3}$ of the outer multipole elements 1, 3 is dimensioned such that the threefold astigmatism $A_2$ has vanished.

In accordance with the above, more detailed description, the amount $\Delta z$ in accordance with the invention is selected such that for predetermined lengths L and L' of the multipole elements 1, 2, and 3, the axial three-lobed aberration of fourth order $D_4$ vanishes, wherein the length of the central multipole 2 has a ratio k with respect to the lengths L' of the outer multipole elements 2 and 3 such that for a predetermined ratio M=f/f' between the focal lengths f of the round lenses 7' and 8' and the focal lengths f' of the round lenses 7" and 8" the axial three-lobed aberration $D_6$ has vanished in accordance with the invention.

A beam which is bundled by condenser lens(es) and comes from the beam source enters the corrector 5 with a round shape, which is shown by the axial beam path $u_\alpha$ and the off-axis beam path $u_\gamma$. The beam is initially deformed by the first outer multipole element 1 and in the first half of the central multipole element 2 it is made round again, is again deformed in a threefold manner in the second half of the multipole element 2 and is made round again with the third outer multipole element 3. The non-round beam regions are used for the described aberration correction based on O. Scherzer (see above). This is the basis of the inventive particle-optical corrector 5.

Furthermore shown are additional hexapole doublets 9, 9' and 10, 10', which are arranged between the round lenses 7' and 7" and 8' and 8" of the round lens doublets 7 and 8, wherein the symmetry planes 9", 10" of the hexapole doublets 9, 9' and 10, 10' are each arranged at separations from the round lenses 7', 7", 8', 8" that are equal to their focal lengths f, f'.

The structure of and the application of current to these hexapole doublets 9, 9', and 10, 10' are chosen to eliminate parasitic aberrations caused by construction errors of the electron microscope or of the corrector 5 by means of small variations in the three-lobed aberration of fourth order $D_4$ inside the corrector and hence generating aberrations of opposite sign.

The drawing also shows a transfer lens system 11 that is arranged downstream of the corrector and comprises two transfer lenses 11' and 11". These lenses have differing focal lengths f" and f'" which are selected to eliminate the spherical aberrations of the objective lens 13. For an exact adjustment of this elimination, the focal lengths f", f'" can be varied within a certain range through excitation of the coils of the transfer lenses 11' and 11". The spherical aberrations must be eliminated before the beam impinges on the sample 14.

The transfer lens system 11 may accommodate electromagnets 12, 12' for a scanning electron microscope for deflecting the scanning beam.

Figure 2A:
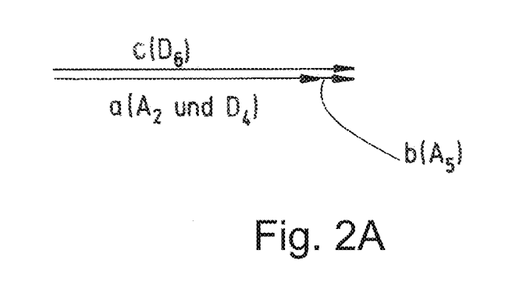
FIG. 2A shows a first comparison of aberration compensation between prior art and the invention using vectors.
Figure 2B:
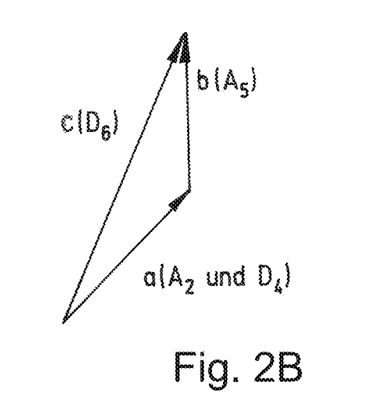
FIG. 2B shows a second comparison of aberration compensation between prior art and the invention using vectors.
Figure 2C:
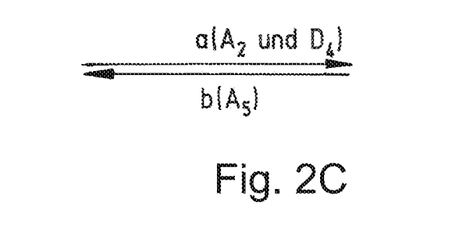
FIG. 2C shows a third comparison of aberration compensation between prior art and the invention using vectors.

FIGS. 2A, 2B and 2C illustrate aberration compensations of prior art and of the invention by means of vectors a, b and c.

The vector a is generated by the combination aberration of $A_2$ and $D_4$ in the hexapole field and the vector b by the combination aberration of $A_5$ in the hexapole field. The vector c is the resultant of vectors a plus b and gives the aberration $D_6$. These are two-dimensional vectors in a plane perpendicular to the axis.

FIG. 2A shows how in the Rose corrector (see above) the vectors a and b lead to the resultant c. The fact that this resultant is generated here is due to the fact that the combination aberration from $A_2$ and $D_4$, that forms vector a, and the small combination aberration from $A_5$ of the vector b cannot compensate for each other. The vector c is approximately as large as the vector a, which has already caused about the total aberration $D_6$.

FIG. 2B shows the same for the delta corrector (see above), in which a resulting aberration $D_6$ occurs, since the vectors a and b partially point in the same direction.

FIG. 2C finally shows how the combination aberration vectors a and b of the aberrations $A_2$ and $D_4$ and $A_5$ are oriented in parallel but opposite to one another, i.e. have different signs. For this reason, the combination aberrations of $A_2$ and $D_4$ cancel one another with the hexapole field and the combination aberration of $A_5$ with the hexapole field cancel one another such that no $D_6$ aberration remains.

FIGS. 3A to 3I each show ronchigrams, which are bright-field images of round beam bundles used for imaging, e.g. of the beams of a scanning electron microscope that would scan the object. A central area is visible which has no structures due to its high magnification (image with almost point-like focused probe of finite size). This means that the focusing of this central aperture region is almost ideal. This region is surrounded by substantially hexagonal structures. The outer aperture regions are mapped in threefold or sixfold tails of the focused probe such that larger areas of the object (which is supposed to be amorphous) are reached, i.e. the magnification decreases and consequently structures become visible. FIGS. 3A, 3C, 3E, 3F and 3H show the beam bundles without compensation and FIGS. 3B, 3D, 3G and 3I with compensation (analogous to Morishita in EP 3 255 649 A1—see above). This was based on a typical objective lens to be corrected (f=1.4 mm, Cs=1.1 mm) with low acceleration voltage (30 kV) and a monochromatized electron source (ΔE=0.1 eV) The "aberration-free aperture" is shown with a maximum phase shift of $\pi$ for illustrative purposes. Table 1 shows the aberration coefficients relating to the images.

| [mm] | 3a | 3b | 3c | 3d | 3e | 3f | 3g | 3h | 3i |
|---|---|---|---|---|---|---|---|---|---|
| $D_4$ | 0 | 0.02/180° | 0 | 0.03/180° | 0 | 0 | 0.02/117° | 0 | 0 |
| $A_5$ | 0.2/90° | 0.2/90° | 0 | 0 | 0 | 0 | 0 | 0 | 0.1/−47° |
| $D_6$ | 4.3/0° | 4.3/0° | 8.9/0° | 8.9/0° | 0 | 4.3/−63° | 4.3/−63° | 0 | 0.2/22° |
| $G_7$ | — | — | — | — | 252/0° | — | — | 1.6/−133° | 1.6/−133° |
| $D_8$ | — | — | — | — | — | — | 35/−23° | 21/−158° | 21/−158° |

35

Figure 3A:
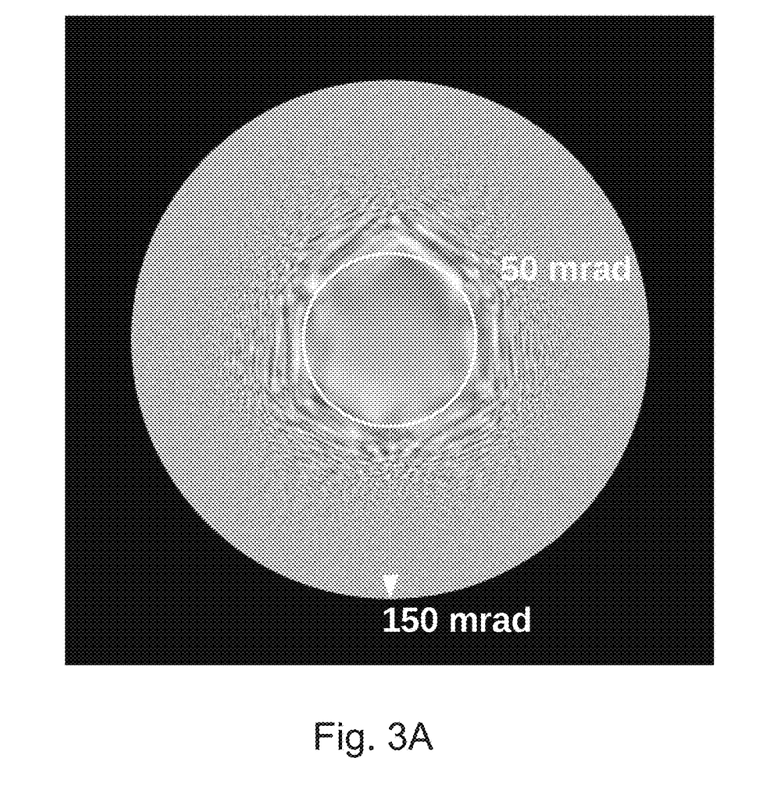
FIG. 3A shows a first ronchigram bright-field image of round beam bundles used for imaging.

FIG. 3A shows a ronchigram of the corrector according to Müller et al. (2006—see above). This is a two hexapole corrector without optimization. The aberration-free aperture of the beam bundle is 50 mrad.

Figure 3B:
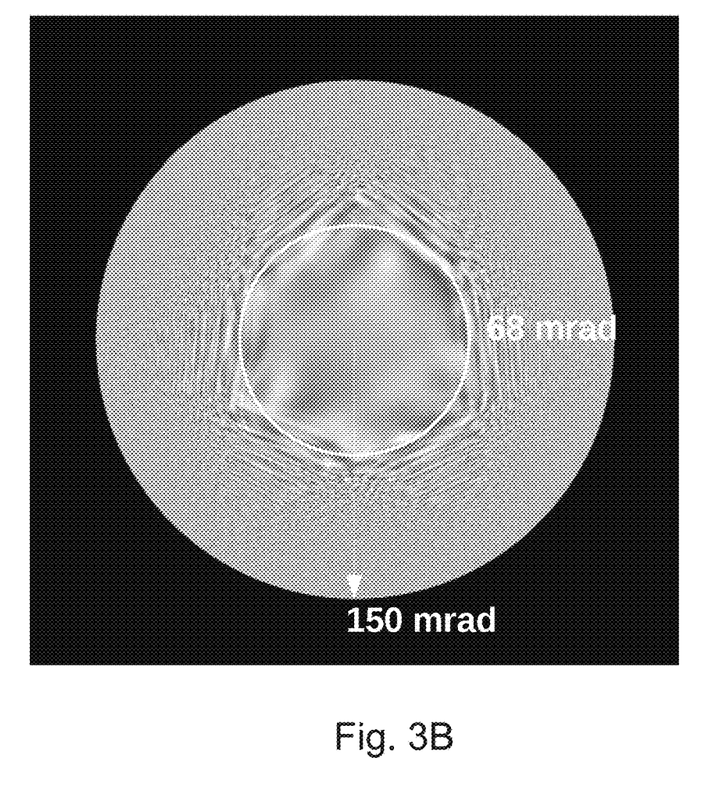
FIG. 3B shows a second ronchigram bright-field image of round beam bundles used for imaging.

FIG. 3B shows a ronchigram of the same corrector with optimization, wherein the aberration-free aperture of the beam bundle is 68 mrad.

Figure 3C:
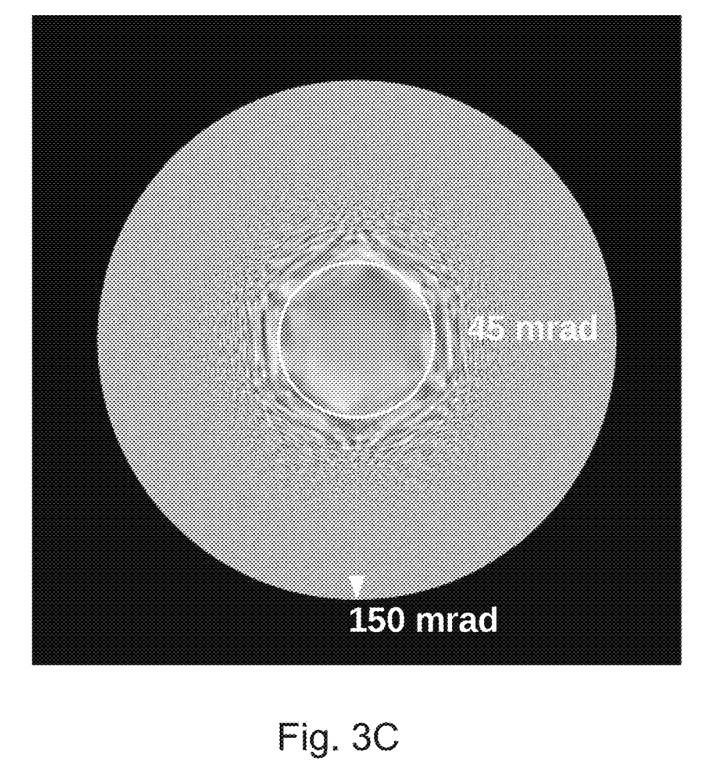
FIG. 3C shows a third ronchigram bright-field image of round beam bundles used for imaging.

FIG. 3C shows a ronchigram of the two hexapole corrector known from EP 2 325 862 A1 and EP 2 325 863 B1, respectively (each by S. Henstra—see above) with double normal excitation of the hexapoles and the additional multipole with reference numeral 126. The aberration-free aperture of the beam bundle is 45 mrad.

Figure 3D:
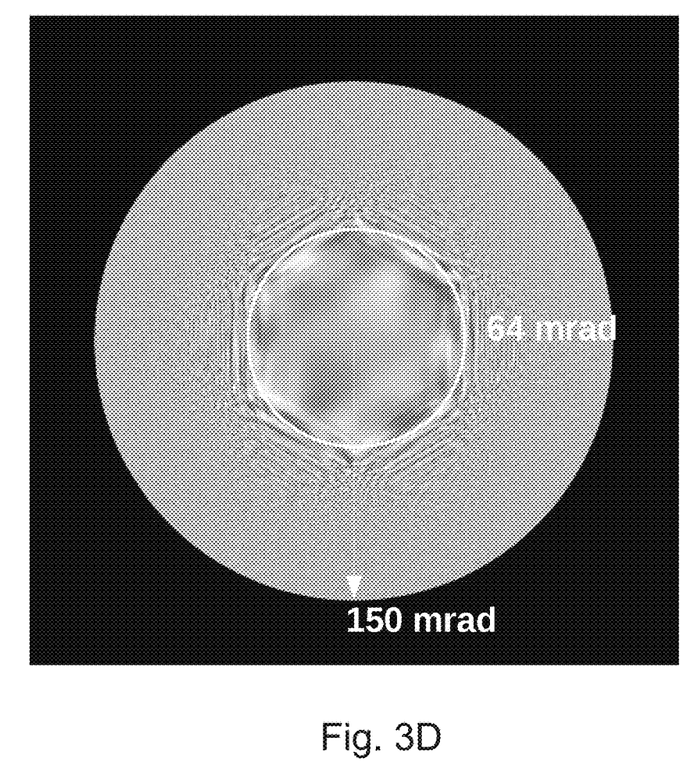
FIG. 3D shows a fourth ronchigram bright-field image of round beam bundles used for imaging.

FIG. 3D shows a ronchigram of this corrector with phase shift optimization, wherein an aberration-free aperture of 64 mrad is achieved.

Figure 3E:
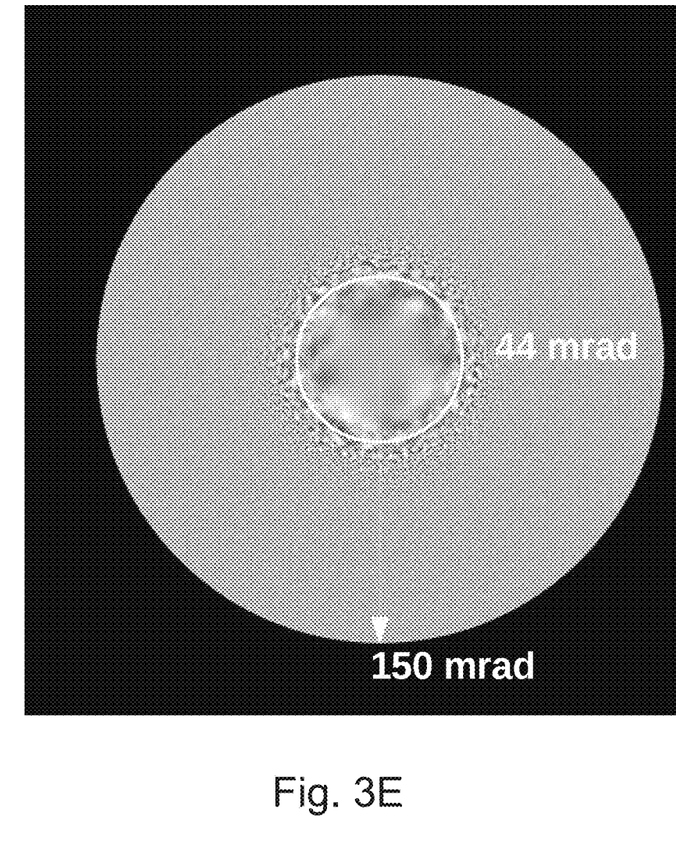
FIG. 3E shows a fifth ronchigram bright-field image of round beam bundles used for imaging.

FIG. 3E shows the Henstra corrector according to FIGS. 3C and 3D, respectively, with the additional twelve-pole with reference numeral 128. Due to the chaplet aberration ($G_7$) introduced by the twelve pole, the aberration-free aperture is only 44 mrad.

Figure 3F:
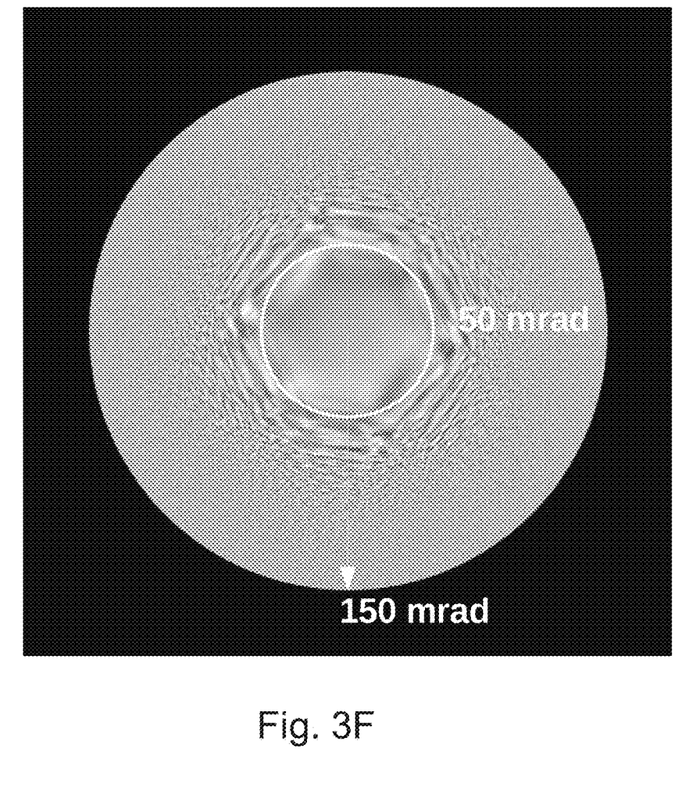
FIG. 3F shows a sixth ronchigram bright-field image of round beam bundles used for imaging.
Figure 3G:
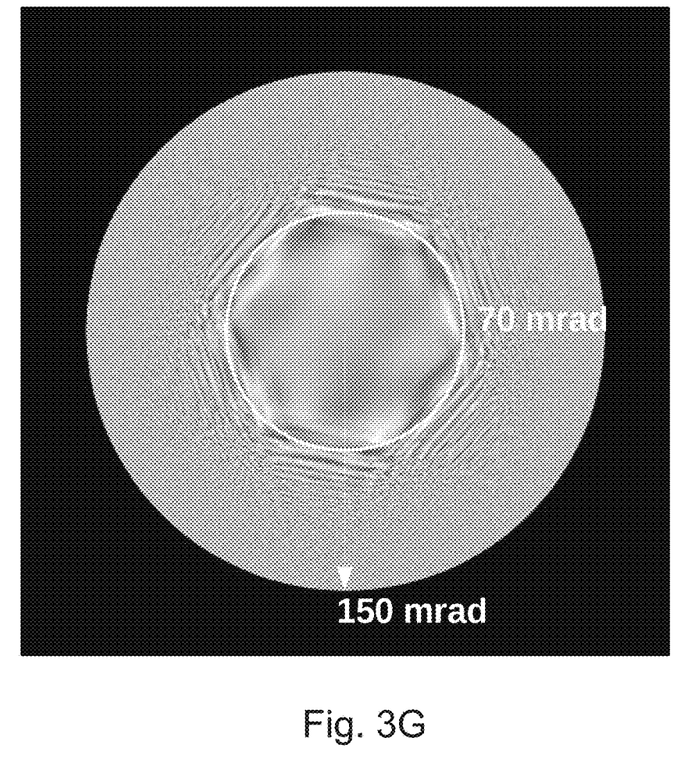
FIG. 3G shows a seventh ronchigram bright-field image of round beam bundles used for imaging.

FIGS. 3F and 3G show the above-mentioned delta corrector with and without optimization, wherein aberration-free apertures of 50 mrad and 70 mrad are achieved.

Figure 3H:
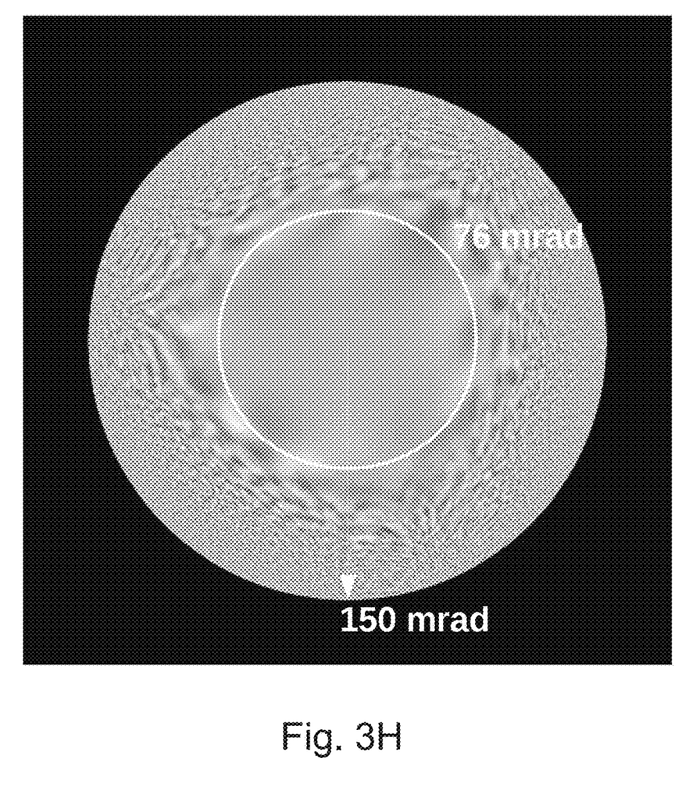
FIG. 3H shows an eighth ronchigram bright-field image of round beam bundles used for imaging.
Figure 3I:
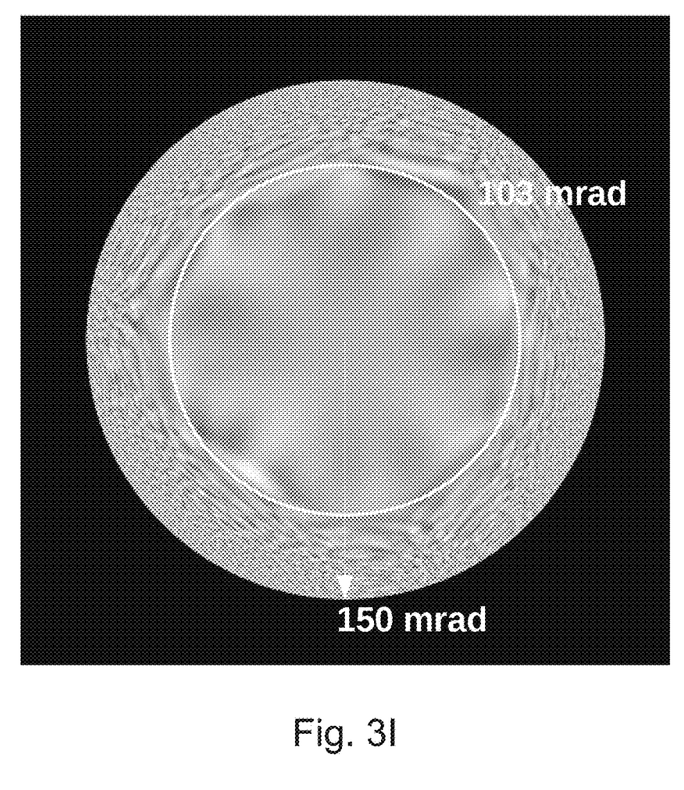
FIG. 3I shows a ninth ronchigram bright-field image of round beam bundles used for imaging.

FIGS. 3H and 3I finally show the inventive corrector, which in the uncompensated state achieves an aberration-free aperture of 76 mrad and an aberration-free aperture of 103 mrad, if the phase shift is optimized. This optimization is achieved by the measures in accordance with a corresponding dependent claim.

LIST OF REFERENCE NUMERALS

1 first outer multipole element
1' symmetry plane of the first outer multipole element
2 central multipole element
3 second outer multipole element
3' symmetry plane of the second outer multipole element
$\Psi_{HP2}$ strength of the hexapole field of the central multipole element
$\Psi_{HP1,3}$ strengths of the outer identical multipole elements 1 and 3
L length of the central multipole element 1
L' lengths of the identical multipole elements 2 and 3
4 optical axis
5 corrector
6 symmetry plane of the corrector
7 round lens doublet
7' round lens (closer to symmetry plane)
7" round lens (further away from symmetry plane)
8 round lens doublet
8' round lens (closer to symmetry plane)
8" round lens (further away from symmetry plane)
f focal lengths of 7' and 8'
f' focal lengths of 7" and 8"
Δz additional separation
9, 9' hexapole doublet
10, 10' hexapole doublet
9", 10" symmetry planes of the hexapole doublets 9, 9' and 10, 10'
11 transfer lens system
11' first transfer lens
11" second transfer lens
f", f''' different focal lengths of the transfer lenses 11', 11"
12, 12' electromagnets for deflecting the scanning beam
13 objective lens
13', 13" objective lens fields
f'''' focal length objective lenses
14 sample
15 detector
16 condenser lens
$u_\alpha$ axial beam path
$u_\gamma$ off-axis beam path
α aperture angle
a vector of the aberrations $A_2$ and $D_4$ in the hexapole field
b vector of the aberrations $A_5$ in the hexapole field
c vector of the field $D_6$, which is the resultant of a and b.

Formulas diffraction: $\lambda/\alpha$ relative shift: $d = \Delta z/L'$ intermediate magnification: $M = f/f'$ length ratio: $k = L/L'$ ratio of the hexapole strengths:

$$\frac{\Psi_{HP2}}{\Psi_{HP1,3}} = \frac{2}{k \cdot M^3}$$

permeability of the vacuum: $\mu_0 = 4\pi \cdot 10^{-7}$ As/Vm strength of the hexapole: $\Psi = \mu_0 \cdot N \cdot I \cdot R^{-3}$ $D_4$ rule:

$$d = \frac{\Delta z}{L'} = \frac{10k - \sqrt{5} \cdot \sqrt{9M^4 - k^2}}{30M^2}$$

$D_{6x}$ integrals: $\Delta D_{6x}^{(a)} = 3\int \Psi(z) \cdot X_{\langle A2 \rangle}(z) \cdot X_{\langle D4 \rangle}(z) \cdot u_\alpha(z) dz$ and $\Delta D_{6x}^{(b)} = 3\int_{HP2} \Psi(z) \cdot X_{\langle A5 \rangle}(z) \cdot u_\alpha^2(z) dz$

The invention claimed is:

1. A particle-optical corrector for correcting spherical aberrations of an electron microscope, thereby preventing a threefold axial astigmatism, an axial three-lobed aberration of fourth order and a sixfold axial astigmatism, wherein the corrector comprises:
    a first outer multipole element of length L' for generating a first hexapole field;
    a second central multipole element of length L for generating a second hexapole field in a symmetry plane of the corrector;
    a third outer multipole element of length L' for generating a third hexapole field, wherein said first outer multipole element and said third outer multipole element are identical and said first and said third hexapole fields have identical strengths, wherein a strength of said second hexapole field is selected with respect to strengths of said first and said third hexapole fields such that the threefold axial astigmatism vanishes, said strengths of said first and said third hexapole fields thereby being selected such that the corrector does not have the sixfold axial astigmatism;
    a first round lens doublet having a first doublet first round lens and a first doublet second round lens, wherein said first doublet second round lens is disposed closer to said symmetry plane than said first doublet first round lens, said first doublet second round lens having a first focal length, wherein said first doublet second round lens is disposed at a separation from said symmetry plane which is equal to said first focal length, said first doublet first round lens having a second focal length, wherein said first doublet first round lens is disposed at a separation from said first doublet second round lens which is equal to said first focal length plus said second focal length;
    a second round lens doublet having a second doublet first round lens and a second doublet second round lens, wherein said second doublet first round lens is disposed closer to said symmetry plane than said second doublet second round lens, said second doublet first round lens also having said first focal length, wherein said second doublet first round lens is disposed at a separation from said symmetry plane which is also equal to said first focal length, said second doublet second round lens also having said second focal length, wherein said second doublet second round lens is disposed at a separation from said second doublet first round lens which is equal to said first focal length plus said second focal length, wherein said first multipole element is separated from said first doublet first round lens by said second focal length plus an additional separation and said third multipole element is separated from said second doublet second round lens by said second focal length plus said additional separation, said additional separation being selected such that, for said lengths L and L', the axial three-lobed aberration of fourth order vanishes, said length L of said second central multipole element thereby being selected relative to said lengths L' of said first and third outer multipole elements in such a manner that an axial three-lobed aberration of sixth order vanishes for a given ratio between said first and said second focal lengths.

2. The corrector of claim 1, wherein a ratio d between said additional separation and said length L' of said first and said third outer multipole elements is between 0.5 and 0.95 ($d = \Delta z/L' = 0.5$ to $0.95$).

3. The corrector of claim 1, wherein said strength of said second hexapole field with respect to said strength of said first and said third hexapole fields is between 0.33 and 1.7:

$$\left( \frac{\Psi_{HP2}}{\Psi_{HP1,3}} = 0.33 \text{ to } 1.7 \right).$$

4. The corrector of claim 1, wherein said ratio between said first and said second focal lengths M=f/f', is in a range between 0.8 and 1.2.

5. The corrector of claim 4, wherein M=1.15 (±0.01).

6. The corrector of claim 1, wherein a ratio k between said length L of said central multipole element and said length L' of said first and said third outer multipoles k=L/L', is within a range of between 2.0 and 3.5.

7. The corrector of claim 6, wherein k=3.05 (±0.05).

8. The corrector of claim 1, further comprising a first hexapole doublet having a first hexapole doublet symmetry plane and a second hexapole doublet having a second hexapole doublet symmetry plane, wherein said first hexapole doublet is disposed between said first doublet first round lens and said first doublet second round lens with said first hexapole doublet symmetry plane having a separation from said first doublet first round lens equal to said second focal length and a separation from said first doublet second round lens equal to said first focal length, said second hexapole doublet being disposed between said second doublet first round lens and said second doublet second round lens with said second hexapole doublet symmetry plane having a separation from said second doublet first round lens equal to said first focal length and a separation from said second doublet second round lens equal to said second focal length, wherein said first and said second hexapole doublets are structured and excited in such a manner that small variations of the three-lobed aberration of fourth order are generated within the corrector for compensating aberrations caused by construction errors.

9. The corrector of claim 1, further comprising a first hexapole doublet having a first hexapole doublet symmetry plane and a second hexapole doublet having a second hexapole doublet symmetry plane, wherein said first hexapole doublet is disposed between said first doublet first round lens and said first doublet second round lens with said first hexapole doublet symmetry plane having a separation from said first doublet first round lens equal to said second focal length and a separation from said first doublet second round lens equal to said first focal length, said second hexapole doublet being disposed between said second doublet first round lens and said second doublet second round lens with said second hexapole doublet symmetry plane having a separation from said second doublet first round lens equal to said first focal length and a separation from said second doublet second round lens equal to said second focal length, wherein said first and said second hexapole doublets are structured and excited in such a manner as to generate at least one of small variations of residual aberrations, the axial three-lobed aberration of sixth order and the sixfold axial astigmatism in order to permit compensation of parasitic aberrations or to minimize an influence of higher order aberrations of a same multiplicity.

10. The corrector of claim 9, wherein said higher order aberrations of a same multiplicity comprise at least one of a $D_8$ and a $G_7$ aberration.

11. An electron microscope, wherein the electron microscope comprises the corrector of claim 1.

12. The electron microscope of claim 11, wherein the microscope is a scanning electron microscope (REM).

13. The electron microscope of claim 11, wherein the microscope is a scanning transmission electron microscope (STEM).

14. The electron microscope of claim 11, wherein the microscope is a transmission electron microscope (TEM), in which the corrector is arranged downstream of an objective lens with respect to a beam path.

15. The electron microscope of claim 11, further comprising a transfer lens system inserted between the corrector and an objective lens in order to correct for spherical aberrations.

16. The electron microscope of claim 15, wherein said transfer lens system consists essentially of a single transfer lens.

17. The electron microscope of claim 15, wherein said transfer lens system consists essentially of two transfer lenses.

18. The electron microscope of claim 17, wherein said transfer lenses have different focal lengths to completely eliminate objective lens spherical aberrations.

19. The electron microscope of claim 18, wherein said transfer lenses comprise coils, said coils structured for excitation to adjust focal lengths of said transfer lenses in order to eliminate specific objective lens spherical aberrations.

* * * * *